United States Patent
Lin et al.

(10) Patent No.: US 9,726,732 B2
(45) Date of Patent: Aug. 8, 2017

(54) ADAPTIVE BATTERY PARAMETER EXTRACTION AND SOC ESTIMATION FOR LITHIUM-ION BATTERY

(75) Inventors: Jian Lin, Beverly Hills, MI (US); Xidong Tang, Sterling Heights, MI (US); Brian J. Koch, Berkley, MI (US); Joseph M. Lograsso, Troy, MI (US); Damon R. Frisch, Troy, MI (US); Rezina S. Nabi, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 1687 days.

(21) Appl. No.: 12/820,648

(22) Filed: Jun. 22, 2010

(65) Prior Publication Data
US 2011/0309838 A1    Dec. 22, 2011

(51) Int. Cl.
| | |
|---|---|
| H02J 7/00 | (2006.01) |
| G01N 27/416 | (2006.01) |
| G01R 31/36 | (2006.01) |
| H01M 10/48 | (2006.01) |
| B60L 11/18 | (2006.01) |
| H01M 10/0525 | (2010.01) |

(52) U.S. Cl.
CPC ..... *G01R 31/3624* (2013.01); *G01R 31/3651* (2013.01); *H01M 10/48* (2013.01); *B60L 11/1861* (2013.01); *G01R 31/3662* (2013.01); *H01M 10/0525* (2013.01); *Y02E 60/122* (2013.01); *Y02T 10/705* (2013.01); *Y02T 10/7044* (2013.01)

(58) Field of Classification Search
CPC .............. G01R 31/3606; G01R 31/361; G01R 31/3624; G01R 31/3627; G01R 31/3632; G01R 31/3637; G01R 31/3644; G01R 31/3648; G01R 31/3651
USPC .................. 320/132, 133, 149, 152; 702/63; 324/426
See application file for complete search history.

(56) References Cited

U.S. PATENT DOCUMENTS

| | | | | |
|---|---|---|---|---|
| 6,359,419 | B1* | 3/2002 | Verbrugge | B60K 6/44 320/132 |
| 7,609,032 | B2* | 10/2009 | Laig-Hoerstebrock | G01K 7/42 320/150 |
| 7,646,166 | B2* | 1/2010 | Koch | B60L 11/1851 320/104 |
| 8,232,770 | B2* | 7/2012 | Okumura | G01R 31/361 320/132 |
| 8,378,521 | B2* | 2/2013 | Rufer | F02C 6/16 307/51 |
| 2007/0159137 | A1* | 7/2007 | Verbrugge | G01R 31/361 320/132 |

(Continued)

*Primary Examiner* — Richard Isla Rodas
*Assistant Examiner* — Michael Dibenedetto
(74) *Attorney, Agent, or Firm* — John A. Miller; Miller IP Group, PLC

(57) ABSTRACT

A system and method for estimating internal parameters of a lithium-ion battery to provide a reliable battery state-of-charge estimate. The method uses a two RC-pair equivalent battery circuit model to estimate the battery parameters, including a battery open circuit voltage, an ohmic resistance, a double layer capacitance, a charge transfer resistance, a diffusion resistance and a diffusion capacitance. The method further uses the equivalent circuit model to provide a difference equation from which the battery parameters are adapted, and calculates the battery parameters from the difference equation.

12 Claims, 3 Drawing Sheets

(56) References Cited

U.S. PATENT DOCUMENTS

| | | | | |
|---|---|---|---|---|
| 2007/0188143 | A1* | 8/2007 | Plett | G01R 31/3651 320/132 |
| 2007/0285056 | A1* | 12/2007 | Yoon | G06F 1/263 320/116 |
| 2007/0285059 | A1* | 12/2007 | Zettel et al. | 320/132 |
| 2008/0135316 | A1* | 6/2008 | Koch | B60L 11/1851 324/427 |
| 2009/0091299 | A1* | 4/2009 | Lin | H01M 10/441 320/137 |
| 2010/0045239 | A1* | 2/2010 | Oki | B60L 11/1809 320/132 |
| 2010/0076704 | A1* | 3/2010 | Liu | H01M 10/48 702/63 |
| 2010/0090650 | A1* | 4/2010 | Yazami | H01M 10/443 320/132 |
| 2010/0090651 | A1* | 4/2010 | Sahu | G01R 31/3624 320/132 |

\* cited by examiner

ADAPTIVE BATTERY PARAMETER EXTRACTION AND SOC ESTIMATION FOR LITHIUM-ION BATTERY

BACKGROUND OF THE INVENTION

1. Field of the Invention

This invention relates generally to a system and method for estimating battery parameters and, more particularly, to a system and method for adaptively extracting six internal parameters from a lithium-ion battery to provide a reliable state-of-charge (SOC) estimate of the battery based on the battery's open circuit voltage.

2. Discussion of the Related Art

Electric vehicles are becoming more and more prevalent. These vehicles include hybrid vehicles, such as the extended range electric vehicles (EREV) that combines a battery and a main power source, such as an internal combustion engine, fuel cell system, etc., and electric only vehicles, such as the battery electric vehicles (BEV). All of these types of electric vehicles employ a high voltage battery that includes a number of battery cells. These batteries can be different battery types, such as lithium-ion, nickel metal hydride, lead acid, etc. A typical high voltage battery for an electric vehicle may include 196 battery cells providing about 400 volts. The battery can include individual battery modules where each battery module may include a certain number of battery cells, such as twelve cells. The individual battery cells may be electrically coupled in series, or a series of cells may be electrically coupled in parallel, where a number of cells in the module are connected in series and each module is electrically coupled to the other modules in parallel. Different vehicle designs include different battery designs that employ various trade-offs and advantages for a particular application.

Batteries play an important role in powering electrical vehicles and hybrid vehicles. The effectiveness of battery control and power management is essential to vehicle performance, fuel economy, battery life and passenger comfort. For battery control and power management, two states of the battery, namely, state-of-charge (SOC) and battery power, need to be predicted, or estimated, and monitored in real time because they are not measurable during vehicle operation. Battery state-of-charge and battery power can be estimated using an equivalent circuit model of the battery that defines the battery open circuit voltage (OCV), battery ohmic resistance and an RC pair including a resistance and a capacitance using the battery terminal voltage and current. Therefore, both battery states have to be derived from battery parameters estimated from the battery terminal voltage and current. A few battery state estimation algorithms have been developed in the art using different methodologies and some have been implemented in vehicles.

It is well known that battery dynamics are generally non-linear and highly dependent on battery operating conditions. However, for on-board battery parameter estimation, a linear model that has a few frequency modes is used to approximate a battery's dominant dynamics for a specific application, such as power prediction or SOC estimation. The reason for this is mainly due to limited computational power and memory available for on-board applications. In fact, even if there was unlimited computational power and memory, an accurate estimation of all battery parameters in a complex model with as many frequency modes as possible cannot be guaranteed because the extraction of signals, normally battery terminal voltage and terminal current, is limited. Therefore, it is neither practical nor necessary to cover all frequency modes in one model as long as the estimation error caused by model uncertainties is within an acceptable range for a specific application.

In order to minimize the memory and computational cost, a simple battery model is preferred. On the other hand, different applications need to be characterized by different frequency modes. For instance, the feature frequency to characterize the high frequency resistance of a battery is much higher than the feature frequency that characterizes a change in battery power. A simple model with limited frequency modes inevitably introduces errors and uncertainties because it cannot fully cover all feature frequencies for various applications.

U.S. patent application Ser. No. 11/867,497, filed Oct. 4, 2007, now published as Publication No. U.S. 2009/0091299, titled Dynamically Adaptive Method For Determining The State of Charge of a Battery, assigned to the assignee of this invention and herein incorporated by reference, discloses a method for determining battery state-of-charge and battery power using four battery parameters, namely, the battery OCV, ohmic resistance, and the resistance and capacitance of an RC pair.

Lithium-ion batteries have proven to be promising for hybrid electric vehicles. To better control the propulsion battery system in a hybrid electric vehicle for long battery life and good fuel economy, the knowledge of battery internal parameters, such as the OCV, the ohmic resistance, the battery capacitance, etc., is very important. In particular, the OCV is used to estimate the battery state-of-charge (SOC), which is a critical index for the control of batteries.

For some lithium-ion batteries, such as the nano-phosphate based lithium-ion battery, the existing parameter estimation algorithms have difficulty giving an accurate and robust SOC estimate because of a flat mapping curve from the OCV to the battery SOC. In these types of batteries, a chemical phenomenon known as diffusion, well known to those skilled in the art, causes the estimate of the open circuit voltage of the battery to be different from its actual open circuit voltage when no current is being drawn from the battery. For example, for every 10% SOC change, the OCV varies less than 20 mV. Thus, when no current is being drawn from the battery and the battery SOC is constant, the difference between the estimated open circuit voltage and the actual battery open circuit voltage is significant, which causes an error in the estimation of the battery SOC.

Therefore, it may be necessary to develop new estimation algorithms for certain batteries that can better estimate the open circuit voltage more precisely by subtracting all voltage components, including small components with slow dynamics, such as the diffusion voltage, which is considered to be small enough to be negligible for traditional lithium-ion batteries, from the battery terminal voltage. This requires a powerful algorithm to extract more battery parameters corresponding to more voltage components with high efficiency and accuracy. In consideration of the estimation error and measurement error with current in-vehicle sensors, the algorithm is also required to be highly robust to initial conditions, environment variations and measurement noise so as to provide a reliable SOC estimate.

SUMMARY OF THE INVENTION

In accordance with the teachings of the present invention, a system and method are disclosed for estimating internal parameters of a lithium-ion battery to provide a reliable battery state-of-charge estimate. The method uses a two RC-pair equivalent battery circuit model to estimate the battery parameters, including a battery open circuit voltage, an ohmic resistance, a double layer capacitance, a charge transfer resistance, a diffusion resistance and a diffusion capacitance. The method further uses the equivalent circuit model to provide a difference equation from which the battery parameters are adapted, and calculates the battery parameters from the difference equation.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for estimating the parameters of a lithium-ion battery is merely exemplary in nature, and is in no way intended to limit the invention or its applications or uses. For example, the invention has particular application for an on-board algorithm for in-vehicle applications. However, as will be appreciated by those skilled in the art, the battery state estimator of the invention will have other applications other than vehicle applications.

The present invention proposes an algorithm for adaptively estimating battery parameters in real time for battery SOC estimation and other potential applications using fewer look-up tables for better adaptation to the environment and driving conditions, and to achieve high computational efficiency as well as low implementation cost. The invention also provides an adaptive and robust algorithm for an accurate and reliable SOC estimate for battery control and electrical power management. The algorithm discussed below can adaptively extract six internal parameters for lithium-ion batteries and provide a reliable SOC estimate based on one of those extracted battery internal parameters, particularly the open circuit voltage. The advantages of the proposed algorithm include increased robustness to initial conditions, better adaptation to variations in environment, battery state and driving conditions, higher computational efficiency, and low implementation costs.

This proposed algorithm employs a new battery model in the form of a difference equation that directly relates the battery internal parameters to the battery terminal voltage and current. The model is the basis of an adaptive parameter estimation algorithm to be developed. A two RC-pair equivalent circuit is employed to relate the parameters in the new battery model to the battery internal parameters in the equivalent circuit. Based on the new battery model, an adaptive algorithm is developed to extract the battery internal parameters from the measured battery voltage and current. Those extracted battery internal parameters are useful for SOC estimation, power prediction, state-of-health (SOH) monitoring, etc. The open circuit voltage extracted by the adaptive algorithm is used to estimate the battery SOC in real time.

Figure 1:
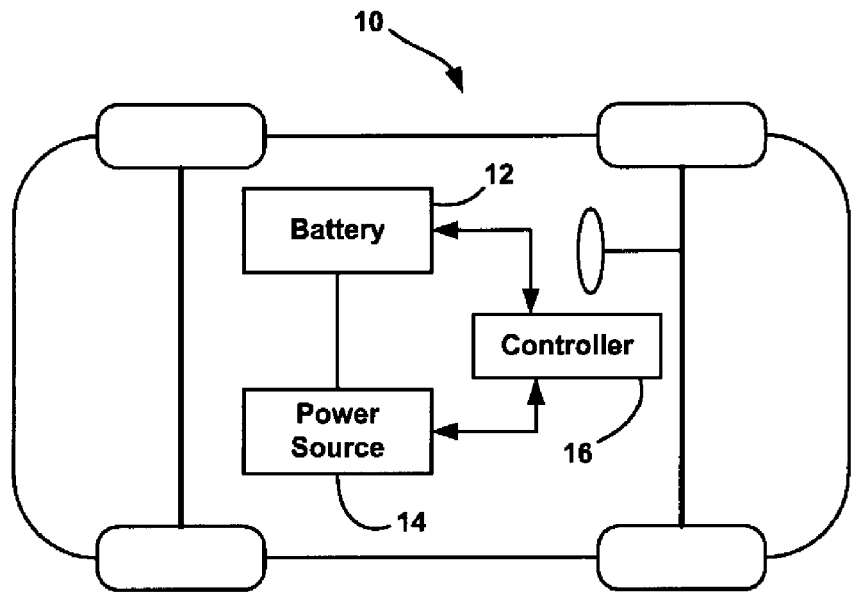
FIG. 1 is a simplified plan view of a hybrid vehicle including a battery and a main power source.

FIG. 1 is a simplified plan view of a vehicle 10 including a high voltage battery 12 and a main power source 14, where the vehicle 10 is intended to represent any hybrid vehicle, such as hybrid internal combustion engine vehicles, fuel cell system vehicle, etc. The vehicle 10 is also intended to represent any electric only vehicle that only employs a battery as the lone power source. The vehicle 10 includes a controller 16 that is intended to represent all of the control modules and devices necessary for the proper operation and control of the power provided by the battery 12 and the power source 14 to drive the vehicle 10, recharge the battery 12 by the power source 14 or regenerative braking, and determine the battery SOC and power capability, as discussed below.

Figure 2:
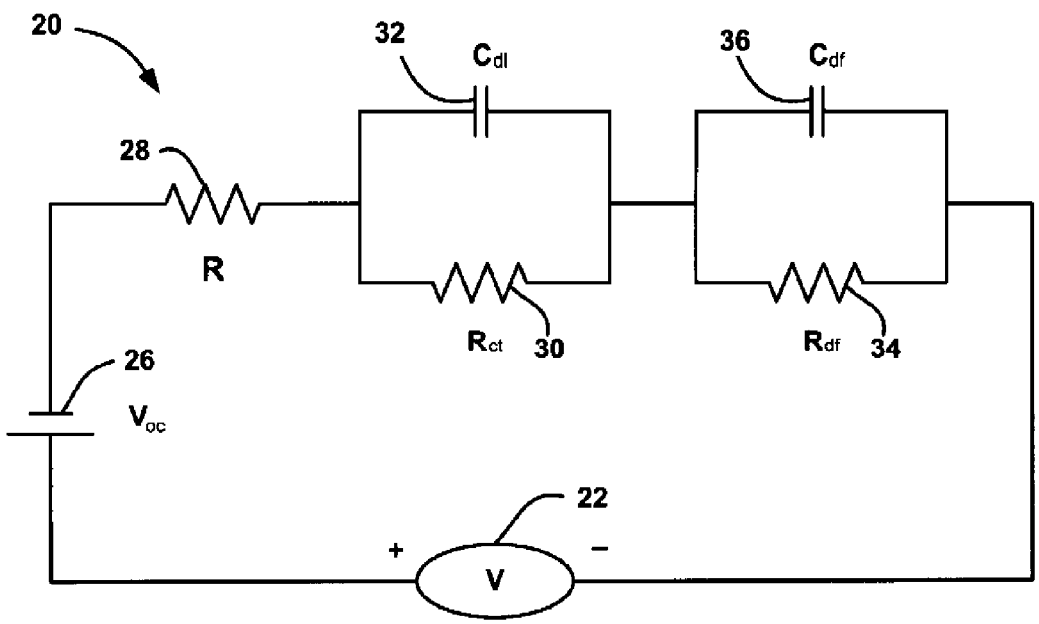
FIG. 2 is a schematic diagram of a two RC-pair equivalent battery circuit.

FIG. 2 is a schematic diagram of a two RC-pair equivalent circuit 20 provided as a battery model. The circuit 20 includes a potential at node 22 that is the battery voltage and includes the battery current. A source 26 represents the battery open circuit voltage $V_{OC}$ and resistor 28 represents the ohmic resistance R of the circuit 20. A first RC-pair includes capacitor 32 being a double layer (dl) capacitance $C_{dl}$ and a resistor 30 being a charge transfer (ct) resistance $R_{ct}$. A second RC-pair includes resistor 34 being a diffusion resistance $R_{df}$ and a capacitor 36 being a diffusion capacitance $C_{df}$. Other battery models may use more complicated equivalent circuits, which may be used in the discussion below for determining the various values.

Using a standard hybrid pulse power characterization (HPPC) test on a lithium-ion battery at different temperatures and SOC levels, and knowing that a second-order linear dynamic system closely matches the battery dynamic behavior characterized by the HPPC test data, it can be determined that a second-order linear dynamic system is a good representation of the battery dynamic behavior. Consequently, the battery model can be represented as a difference equation by:

$$V(k)=v_1V(k-1)+\theta_2V(k-2)+\theta_3I(k)+\theta_4I(k-1)+\theta_5I(k-2)+\theta_6U(k) \qquad (1)$$

Which can also be written as:

$$V(k)=\theta^T\phi(k) \qquad (2)$$

Where k indicates the time step, U(k) represents a unit step function whose value is zero for k<0 and one for k≥0, $\phi(k)=[V(k-1),V(k-2),I(k),I(k-1),I(k-2),U(k)]^T$ is a vector of measured data and known signals, and $\theta=[\theta_1, \theta_2, \theta_3, \theta_4, \theta_5, \theta_6]^T$ is a vector of parameters $\theta_1, \theta_2, \theta_3, \theta_4, \theta_5$ and $\theta_6$.

The parameters $\theta_1, \theta_2, \theta_3, \theta_4, \theta_5$ and $\theta_6$ in difference equation (1) need to be associated to battery internal parameters, such as open circuit voltage, ohmic resistance, etc., so that the battery internal parameters can be derived from the parameters $\theta_1, \theta_2, \theta_3, \theta_4, \theta_5$ and $\theta_6$, which can be estimated by a parameter estimation algorithm based on difference equation (1).

It is known that for a two RC-pair equivalent circuit, as shown in FIG. 2, the battery terminal voltage consists of four parts, which can be expressed as:

$$V(k)=V_{oc}+I(k)R+V_{dl}(k)+V_{df}(k) \qquad (3)$$

Where V(k) is the measured battery terminal voltage, I(k) is the measured battery terminal current, $V_{oc}$, is the open-circuit voltage, R is the ohmic resistance, and $V_{dl}(k)$ and $V_{df}(k)$ are voltages across the two RC pairs, and are a double layer voltage and a diffusion voltage, respectively.

The double layer voltage $V_{dl}$ can be dynamically described by:

$$V_{dl}(k) = \exp\left(-\frac{\Delta t}{R_{ct}C_{dl}}\right)V_{dl}(k-1) + R_{ct}\left(1 - \exp\left(-\frac{\Delta t}{R_{ct}C_{dl}}\right)\right)I(k-1) \quad (4)$$

And similarly the diffusion voltage $V_{df}$ can be dynamically described by:

$$V_{df}(k) = \exp\left(-\frac{\Delta t}{R_{df}C_{df}}\right)V_{df}(k-1) + R_{df}\left(1 - \exp\left(-\frac{\Delta t}{R_{df}C_{df}}\right)\right)I(k-1) \quad (5)$$

Where $R_{ct}$ is the charge transfer resistance, $C_{dl}$ is the double layer capacitance, $R_{df}$ is the diffusion resistance and $C_{df}$ is the diffusion capacitance.

Difference equation (1) is related to the two RC-pair equivalent circuit 20 to establish the relationship between the battery internal parameters and the parameters $\theta_1$, $\theta_2$, $\theta_3$, $\theta_4$, $\theta_5$ and $\theta_6$ in difference equation (1). Combining equations (3), (4) and (5), the two RC-pair equivalent circuit can be represented into the state space form as:

$$\begin{bmatrix} V_{dl}(k) \\ V_{df}(k) \end{bmatrix} = A\begin{bmatrix} V_{dl}(k-1) \\ V_{df}(k-1) \end{bmatrix} + BI(k-1) \quad (6)$$

$$V(k) = C\begin{bmatrix} V_{dl}(k) \\ V_{df}(k) \end{bmatrix} + D\begin{bmatrix} I(k) \\ U(k) \end{bmatrix} \quad (7)$$

Where A, B, C and D are matrices consisting of battery internal parameters, which are given by:

$$A = \begin{bmatrix} a_1 & 0 \\ 0 & a_2 \end{bmatrix} = \begin{bmatrix} \exp\left(-\frac{\Delta t}{R_{df}C_{df}}\right) & 0 \\ 0 & \exp\left(-\frac{\Delta t}{R_{ct}C_{dl}}\right) \end{bmatrix} \quad (8)$$

$$B = \begin{bmatrix} b_1 \\ b_2 \end{bmatrix} = \begin{bmatrix} R_{df}\left(1 - \exp\left(-\frac{\Delta t}{R_{df}C_{df}}\right)\right) \\ R_{ct}\left(1 - \exp\left(-\frac{\Delta t}{R_{ct}C_{dl}}\right)\right) \end{bmatrix} \quad (9)$$

$$C = [1 \quad 1] \quad (10)$$

$$D = [d_1 \quad d_2] = [R \quad V_{oc}] \quad (11)$$

And where $U(k)$ is the unit step function.

Take the z-transform of the state space battery model in equations (6) and (7), and slightly abusing notation gives:

$$z\begin{bmatrix} V_{dl}(z) \\ V_{df}(zk) \end{bmatrix} = A\begin{bmatrix} V_{dl}(z) \\ V_{df}(z) \end{bmatrix} + BI(z) \quad (12)$$

$$V(z) = C\begin{bmatrix} V_{dl}(z) \\ V_{df}(z) \end{bmatrix} + D\begin{bmatrix} I(z) \\ U(z) \end{bmatrix} \quad (13)$$

Where $V(z)$, $I(z)$, $V_{dl}(z)$, $V_{df}(z)$ and $U(z)$ are the z-transform of signals $V(k)$, $I(k)$, $V_{dl}(k)$, $V_{df}(k)$ and $U(k)$.

Note, equations (12) and (13) are solved to obtain the transfer function of the battery equivalent circuit 20, where:

$$(z-A)^{-1} = \begin{bmatrix} z-a_1 & 0 \\ 0 & z-a_2 \end{bmatrix}^{-1} = \begin{bmatrix} \frac{1}{z-a_1} & 0 \\ 0 & \frac{1}{z-a_2} \end{bmatrix} \quad (14)$$

Solve equation (11) as:

$$\begin{bmatrix} V_{dl}(z) \\ V_{df}(z) \end{bmatrix} = \begin{bmatrix} \frac{1}{z-a_1} & 0 \\ 0 & \frac{1}{z-a_2} \end{bmatrix}\begin{bmatrix} b_1 \\ b_2 \end{bmatrix}I(z) \quad (15)$$

Substituting equation (15) into equation (13), and expanding gives:

$$V(z) = [1 \quad 1]\begin{bmatrix} V_{dl}(z) \\ V_{df}(z) \end{bmatrix} + RI(z) + V_{oc}U(z) \quad (16)$$

$$= [1 \quad 1]\begin{bmatrix} \frac{b_1}{z-a_1} & 0 \\ 0 & \frac{b_2}{z-a_2} \end{bmatrix}I(z) + RI(z) + V_{oc}U(z) \quad (17)$$

$$= \frac{b_1(z-a_2) + b_2(z-a_1)}{(z-a_1)(z-a_2)} + RI(z) + V_{oc}U(z) \quad (18)$$

Equation (18) is the transfer function of the two RC-pair battery equivalent circuit 20. The transfer function of equation (18) describes the input-to-output relationship of a battery whose electrical dynamics can be characterized by the two RC-pair battery equivalent circuit 20 and given by equations (3), (4), and (5).

Taking the inverse z-transform gives the following difference equation:

$$V(k) = (a_1+a_2)V(k-1) + (-a_1a_2)V(k-2) + RI(k) + [(b_1-b_2) - R(a_1+a_2)]I(k-1) + (a_1a_2R - b_1a_2 - b_2a_1)I(k-2) + [1 - (a_1+a_2) + a_1a_2]V_{oc}U(k) \quad (19)$$

Recall the battery model given by difference equation (1) that is determined by the HPPC test data. If both difference equations (1) and (19) describe the same battery electrical dynamics, they are equivalent. Therefore, the following equations relate the battery internal parameters defined in the equivalent circuit and the parameters from difference equation (1).

$$\theta_1 = (a_1+a_2) \quad (20)$$

$$\theta_2 = (-a_1a_2) \quad (21)$$

$$\theta_3 = R \quad (22)$$

$$\theta_4 = [(b_1-b_2) - R(a_1+a_2)] \quad (23)$$

$$\theta_5 = (a_1a_2R - b_1a_2 - b_2a_1) \quad (24)$$

$$\theta_6 = [1 - (a_1+a_2) = a_1a_2] \quad (25)$$

Or inversely:

$$V_{oc} = \frac{\theta_6}{1 - \theta_1 - \theta_2} \quad (26)$$

$$R = \theta_3 \tag{27}$$

Other parameters can also be calculated from equations (21)-(26). For the applications of SOC estimation and power prediction, the battery parameters in the form of $V_{oc}$, R, $a_1$, $a_2$, $b_1$ and $b_2$ are useful. However, with further calculations based on equation (13), the battery internal parameters can be obtained in the form of $V_{oc}$, R, $R_{ct}$, $C_{dl}$, $R_{df}$ and $C_{df}$, which carry real physical meaning and can be used in a variety of applications for battery diagnosis and prognosis.

Figure 3:
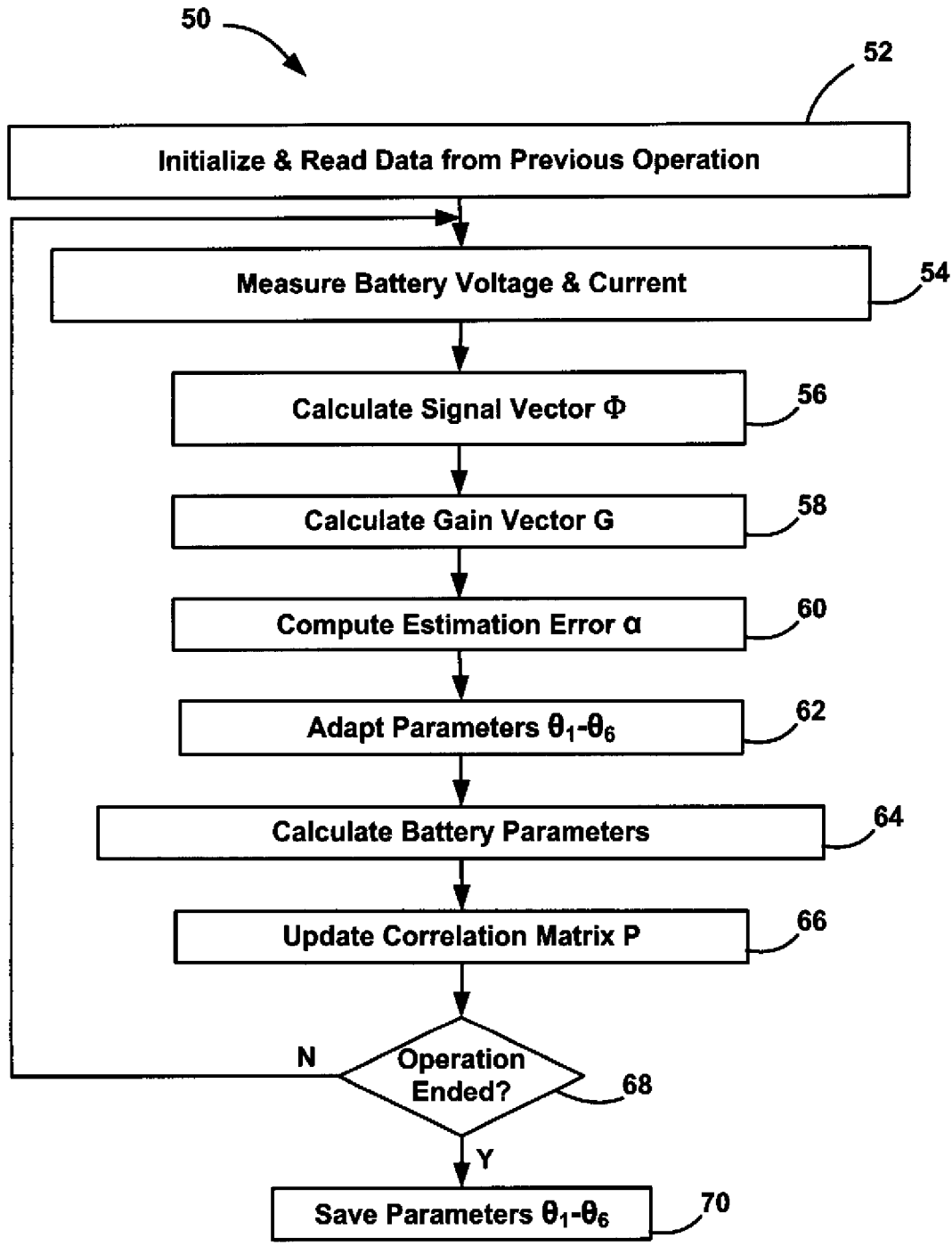
FIG. 3 is a flow chart diagram for an algorithm for extracting six parameters from a battery.

FIG. 3 is a flow chart diagram 50 showing a process for an adaptive algorithm based on difference equation (1) to estimate the parameters $\theta_1$, $\theta_2$, $\theta_3$, $\theta_4$, $\theta_5$ and $\theta_6$, and then calculate the battery internal parameters from the parameters $\theta_1$, $\theta_2$, $\theta_3$, $\theta_4$, $\theta_5$ and $\theta_6$ using equation (13). The algorithm start at box 52 with an initialization by reading a first pair of data including the battery voltage V(k) and the battery current I(k), setting initial values for the parameters $\theta_1$, $\theta_2$, $\theta_3$, $\theta_4$, $\theta_5$ and $\theta_6$ from the estimated result of the last operation from memory, and studying the initial correlation matrix P as a 6×6 positive definite matrix. The algorithm then reads the measured battery voltage V(k) and current I(k) at box 54. The algorithm then calculates a signal vector $\Phi(k)$ from the measured battery voltage V(k) and current I(k), the battery and current data from previous measurements, namely, V(k−1), V(k−2), I(k−1) and I(k−2) and the unit step function U(k−1)=1 using equations (1) and (2) at box 56.

The algorithm then calculates a gain vector G as a least squares regression at box 58, which is a 6×1 vector including four gains for the four unknown parameters $\theta_1$, $\theta_2$, $\theta_3$, $\theta_4$, $\theta_5$ and $\theta_6$, respectively, as:

$$G(k) = \frac{P(k-1)\phi(k)}{\lambda + \phi^T(k)P(k-1)\phi(k)} \tag{28}$$

Where $0<\lambda \leq 1$ is a pre-selected forgetting factor.

The algorithm then computes an estimation error $\alpha(k)$ at box 60 as:

$$\alpha(k) = V(k)\theta^T\phi(k) \tag{29}$$

The algorithm then adapts the parameters $\theta_1$, $\theta_2$, $\theta_3$, $\theta_4$, $\theta_5$ and $\theta_6$ at box 62 to minimize the estimation error $\alpha$ using:

$$\theta(k) = \theta(k-1) + G(k)\alpha(k) \tag{30}$$

The algorithm then calculates the battery parameters for the open circuit voltage $V_{oc}$, the ohmic resistance R, and the coefficients $a_1$, $a_2$, $b_1$ and $b_2$ from the parameters $\theta_1$, $\theta_2$, $\theta_3$, $\theta_4$, $\theta_5$ and $\theta_6$ using equation (28) at box 64. The algorithm then updates the correlation matrix P for the next data point at box 66 using:

$$P(k) = \frac{1}{\lambda}P(k-1) - \frac{1}{\lambda}G(k)\phi^T(k)P(k) \tag{31}$$

The algorithm then determines whether the operation has ended at decision diamond 68, and if so, saves the parameters $\theta_1$, $\theta_2$, $\theta_3$, $\theta_4$, $\theta_5$ and $\theta_6$ for the next operation at box 70. If the operation has not ended at the decision diamond 68, the algorithm stores the current battery voltage V(k) and current I(k) for the next time period and returns to the box 54 to get the new battery voltage and current measurements.

Once the algorithm has the parameters $\theta_1$, $\theta_2$, $\theta_3$, $\theta_4$, $\theta_5$ and $\theta_6$ using the battery parameter extraction algorithm, a SOC estimation algorithm is employed to infer the battery SOC. In this embodiment, the SOC is estimated by combining a voltage based $SOC_V$ that is based on a thermodynamic voltage $V_O$ and a current based $SOC_I$ that is provided through Coulomb integration. The relationship between the thermodynamic voltage $V_O$, the open circuit voltage $V_{OC}$ and a hysteresis voltage $V_h$ is given by:

$$V_o(k) = V_{oc}(k) - V_h(k) \tag{32}$$

Where $V_h$ is the hysteresis voltage governed by:

$$V_h(k) = V_h(k-1) + \theta_7 I(k-1)[V_{h\,max} - \text{sign}(I(k-1))V_h(k-1)] \tag{33}$$

And where $\theta_7$ is a parameter to determine hysteresis behavior and $V_{h\,max}$ is the maximum value of the hysteresis voltage $V_h$.

The hysteresis model of equation (33) describes a type of hysteresis with a fast convergence to a hysteresis boundary from any point inside the boundary, which can be observed in several lithium-ion batteries. With such a switch type of hysteresis model, the voltage based $SOC_V$ estimation is robust to the initial hysteresis voltage in the sense that it is not necessary to require accurate knowledge of the initial hysteresis voltage $V_h$ because the hysteresis voltage $V_h$ governed by the model quickly converges to the boundary wherever it starts.

One point of novelty of the SOC estimation algorithm is that it takes an adaptive technique to tune weights w for the voltage based $SOC_V$ as determined by voltage $V_O$, and the current based $SOC_I$ to produce the combined SOC estimate, and uses the combined SOC estimate as the new starting point for the next update so as to reduce the dependency on the initial SOC and increase the algorithm robustness.

Figure 4:
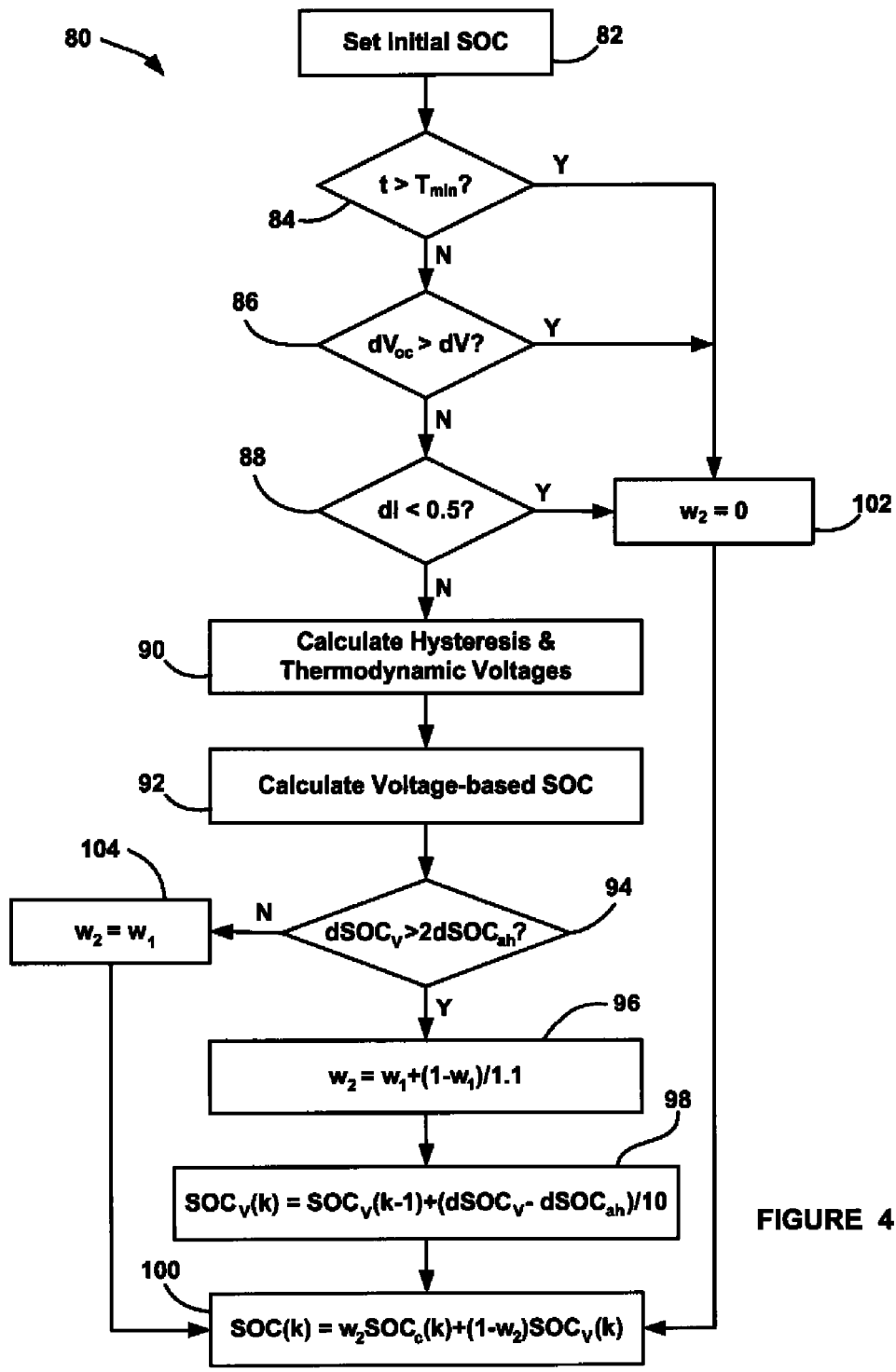
FIG. 4 is a flow chart diagram for an algorithm for estimating battery state-of-charge.

The SOC estimation algorithm discussed above is illustrated in FIG. 4 as flow chart diagram 80. The algorithm starts with an initialization at box 82 that sets the initial value of the SOC by reading the SOC estimation of the last operation from memory. The initialization further includes reading the battery terminal voltage V(k) and current I(k) and the open circuit voltage estimation $V_{OC}$ from the battery parameter extraction process discussed above. The algorithm also sets a weighting value $w_1$ equal to a predetermined value, such as 0.996.

The SOC estimation algorithm then determines whether the estimated open circuit voltage $V_{OC}$ is valid by determining if enough time has gone by from the start of the SOC estimation process, for example, 200 seconds, at decision diamond 84, whether $dV_{OC}$ is greater than dV at decision diamond 96 and whether dI has been less 0.5 in the past 10 seconds at decision diamond 88. If all of these determinations from the decision diamonds 84, 86 and 88 is no, then the open circuit voltage $V_{OC}$ is valid, and the algorithm proceeds to calculate the hysteresis voltage $V_h$ using equation (33) and the thermodynamic voltage $V_O$ using equation (32) at box 90. The algorithm then calculates the voltage based $SOC_V$ for the current time period using the valid thermodynamics voltage $V_O$ and the estimated current based $SOC_I$ for the current time step at box 92 using:

$$SOC_I(k) = SOC(k-1) + I(k)\delta t \tag{34}$$

Where SOC(k−1) is the combined SOC estimate of the last time step and $I(k)\delta t$ is the current contribution from the Coulomb integration.

The algorithm then calculates the difference between $SOC_I(k)$ and $SOC_V(k)$ and determines whether $dSOC_V$ is greater than $xdSOC_{ah}$ at decision diamond 94, where x is a number. If the SOC meets the requirements of the decision diamond 94, then the algorithm sets weighting value $w_2=w_1+(1-w_1)/1.1$ at box 96 that tunes the weighting factor w based on the difference between the current based $SOC_I(k)$ and the voltage based $SOC_V(k)$. The algorithm then calculates the voltage based $SOC_V$ as:

$$SOC_V(k)=SOC_V(k-1)+(dSOC_V-dSOC_{ah})/10 \quad (35)$$

The algorithm then combines the voltage based $SOC_V(k)$ with the weighting factor $w_2$ at box 100 as:

$$SOC(k)=w_2 SOC_c(k)+(1-w_2)SOC_V(k) \quad (36)$$

If none of the conditions have been met at the decision diamonds 84, 86 and 88 for a valid open circuit voltage $V_{OC}$, then the algorithm sets the weighting value $w_2=0$ at box 102 and proceeds to determine SOC(k) using equation (36) at the box 100. Likewise, if the requirement at decision diamond 94 has been not met, the algorithm sets the weighting value $w_2$ equal to the weighting value $w_1$ at box 104, and proceeds to calculate the SOC(k) using equation (36) at the box 100.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for estimating battery parameters of a battery, said method comprising:
    reading, using a voltmeter and a current sensor electrically coupled to the battery, a measured battery voltage and a measured battery current, respectively;
    calculating, using a controller in communications with the voltmeter and the current sensor, said controller including a processor and a memory, a signal vector based on the measured battery voltage and current and a previous battery voltage and current;
    calculating a gain vector using the signal vector and a correlation matrix;
    calculating an estimation error using the measured battery voltage and the signal vector;
    adapting the battery parameters using the gain vector and the estimation error;
    calculating a battery open circuit voltage and a battery resistance using the adapted battery parameters;
    determining, using the controller, a battery state-of-charge using the battery open circuit voltage, including combining a voltage based state-of-charge and a current based state-of-charge using an adaptive weighting factor, where the voltage based state-of-charge is determined by a thermodynamic voltage and the current based state-of-charge is determined by Coulomb integration, and the adaptive weighting factor is adapted at each time step by an amount which is based on a validity of the battery open circuit voltage and based on a relationship between the rate of change of the voltage based state-of-charge and the rate of change of the current based state-of-charge; and
    using the battery state-of-charge, by the controller, for power management of the battery, including controlling charging and discharging of the battery.

2. The method according to claim 1 wherein the method estimates six battery parameters.

3. The method according to claim 1 wherein the method estimates the battery open circuit voltage, an ohmic resistance, a double layer capacitance, a charge transfer resistance, a diffusion resistance and a diffusion capacitance.

4. The method according to claim 1 wherein the method uses a two RC-pair equivalent battery circuit model to estimate the battery parameters.

5. The method according to claim 1 wherein calculating a gain vector includes using the equation:

$$G(k) = \frac{P(k-1)\phi(k)}{\lambda + \phi^T(k)P(k-1)\phi(k)}$$

where G is the gain vector, P is the correlation matrix, $\Phi$ is the signal vector and $\lambda$ is a forgetting factor.

6. The method according to claim 1 wherein calculating an estimation error includes using the equation:

$$\alpha(k)=V(k)-\theta^T\phi(k)$$

where $\alpha$ is the estimation error, V is the measured voltage, $\theta$ is the battery parameters and $\Phi$ is the signal vector.

7. The method according to claim 1 wherein adapting the battery parameters includes using the equation:

$$\theta(k)=\theta(k-1)+G(k)\alpha(k)$$

where $\theta$ are the battery parameters, G is the gain vector and $\alpha$ is the estimation error.

8. The method according to claim 1 wherein the battery is a lithium-ion battery.

9. The method according to claim 1 wherein the battery is a vehicle battery on an electric vehicle and wherein the method is performed during operation of the vehicle.

10. A method for estimating battery parameters of a battery, said method comprising:
    defining an equivalent battery circuit model of the battery that includes a battery open circuit voltage, a battery ohmic resistance, a first RC pair including a double layer capacitance and a charge transfer resistance and a second RC pair including a diffusion capacitance and a diffusion resistance;
    reading, using a voltmeter and a current sensor electrically coupled to the battery, a measured battery voltage and a measured battery current, respectively;
    representing, using a controller in communications with the voltmeter and the current sensor, said controller including a processor and a memory, the battery circuit model as a difference equation that includes the measured battery voltage and current and a plurality of battery parameters;
    using the difference equation to determine the battery parameters that include the battery open circuit voltage, the ohmic resistance, a double layer capacitance, a charge transfer resistance, a diffusion resistance and a diffusion capacitance;
    determining, using the controller, a battery state-of-charge using the battery open circuit voltage, including combining a voltage based state-of-charge and a current based state-of-charge using an adaptive weighting factor, where the voltage based state-of-charge is determined by a thermodynamic voltage and the current based state-of-charge is determined by Coulomb integration, and the adaptive weighting factor is adapted at each time step by an amount which is based on a validity of the battery open circuit voltage and based on a relationship between the rate of change of the voltage based state-of-charge and the rate of change of the current based state-of-charge; and using the battery state-of-charge, by the controller, for power management of the battery, including controlling charging and discharging of the battery.

11. The method according to claim 10 wherein representing the battery circuit model as a difference equation includes using the equation:

$$V(k) = \theta_1 V(k-1) + \theta_2 V(k-2) + \theta_3 I(k) + \theta_4 I(k-1) + \theta_5 I(k-2) + \theta_6 U(k)$$

where V is the measured voltage, I is the measured current, k is a time step and $\theta_1$, $\theta_2$, $\theta_3$, $\theta_4$, $\theta_5$ and $\theta_6$ are the battery parameters.

12. The method according to claim 10 wherein the battery is a lithium-ion battery.

* * * * *